United States Patent
Hao

(10) Patent No.: US 10,769,553 B2
(45) Date of Patent: Sep. 8, 2020

(54) INTEGRATED CIRCUIT DEVICE AND CIRCUITRY

(71) Applicant: NANYA TECHNOLOGY CORPORATION, New Taipei (TW)

(72) Inventor: Chung-Peng Hao, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/212,012

(22) Filed: Dec. 6, 2018

(65) Prior Publication Data
US 2020/0184365 A1    Jun. 11, 2020

(51) Int. Cl.
| H03B 21/00 | (2006.01) |
| G06N 20/00 | (2019.01) |
| H03K 5/135 | (2006.01) |
| G06F 1/10 | (2006.01) |
| G06N 5/04 | (2006.01) |
| G01R 19/10 | (2006.01) |

(52) U.S. Cl.
CPC .......... *G06N 20/00* (2019.01); *G01R 19/10* (2013.01); *G06F 1/10* (2013.01); *G06N 5/04* (2013.01); *H03K 5/135* (2013.01)

(58) Field of Classification Search
CPC .......... G06N 20/00; G06N 5/04; G01R 19/10; G06F 1/10; H03K 5/135
USPC ...................................................... 327/170
See application file for complete search history.

(56) References Cited

U.S. PATENT DOCUMENTS

| 2003/0197631 A1 | 10/2003 | Corner et al. |
| 2011/0068855 A1 | 3/2011 | Ikenaga |
| 2011/0251807 A1 | 10/2011 | Rada et al. |
| 2019/0041948 A1* | 2/2019 | Kelly ................ G06F 1/26 |

FOREIGN PATENT DOCUMENTS

| CN | 102118153 A | 7/2011 |
| TW | M492577 U | 12/2014 |
| TW | 1542140 B | 7/2016 |

OTHER PUBLICATIONS

Office Action dated Mar. 4, 2020 related to Taiwanese Application No. 107147455.

* cited by examiner

*Primary Examiner* — Metasebia T Retebo
(74) *Attorney, Agent, or Firm* — Muncy, Geissler, Olds & Lowe, P.C.

(57) ABSTRACT

The present disclosure provides an integrated circuit (IC) device and a circuitry. The IC includes a measurement circuit and a classifier circuit. The measurement circuit is configured to acquire a practical voltage. The classifier circuit is configured to: generate an information on an immature classification by comparing a default voltage and the practical voltage; receive an information on a reference classification, wherein the reference classification is acquired by manually comparing the default voltage and the practical voltage; update the default voltage to a learned voltage based on the immature classification and the reference classification; and generate a prediction, based on the learned voltage, for adjusting a slew rate.

16 Claims, 13 Drawing Sheets

30

INTEGRATED CIRCUIT DEVICE AND CIRCUITRY

TECHNICAL FIELD

The present disclosure relates to an integrated circuit device and a circuitry, and more particularly, to an integrated circuit device with a machine-learning function for big data application.

DISCUSSION OF THE BACKGROUND

Integrated circuits, such as field programmable gate arrays (FPGAs), may include circuitry to perform various mathematical operations. For example, a deep learning neural network may be implemented in one or more integrated circuit devices for machine learning applications. The integrated circuit devices may perform several operations to output results for the neural network.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides an integrated circuit (IC) device. The IC device includes a measurement circuit and a classifier circuit. The measurement circuit is configured to acquire a practical voltage. The classifier circuit is configured to generate an information on an immature classification by comparing a default voltage and the practical voltage. The classifier circuit is configured to receive an information on a reference classification, which is acquired by manually comparing the default voltage and the practical voltage. The classifier circuit is configured to update the default voltage to a learned voltage based on the immature classification and the reference classification. The classifier circuit is configured to generate a prediction, based on the learned voltage, for adjusting a slew rate.

In some embodiments, a differential of the practical voltage determines a practical slew rate of a signal, and a differential of the default voltage determines a default slew rate of the signal.

In some embodiments, the learned voltage includes a weighted value of a neural network.

In some embodiments, the measurement circuit includes a first sample-and-hold circuit and a second sample-and-hold circuit. The first sample-and-hold circuit is configured to sample a first voltage of a signal. The second sample-and-hold circuit is configured to sample a second voltage of the signal. The practical voltage is associated with the first voltage and the second voltage.

In some embodiments, the measurement circuit further includes a subtractor circuit. The subtractor circuit is configured to provide the practical voltage by subtracting the first voltage from the second voltage.

In some embodiments, a difference between the immature classification and the reference classification is associated with a weight of a neural network, and the learned voltage includes a weighted value of the neural network.

In some embodiments, the IC device further includes a multiplier. The multiplier is configured to generate the learned voltage by multiplying the default voltage by an updated weight, wherein the updated weight is associated with a default weight.

In some embodiments, the updated weight is associated with an algebraic relationship between the difference and the default weight.

Another aspect of the present disclosure provides an integrated circuit (IC) device. The IC device includes a comparator and a subtractor circuit. The comparator has an input coupled to a practical voltage. The subtractor circuit has an input coupled to an output of the comparator and another input coupled to a reference voltage. Another input of the comparator is coupled from a default voltage to a learned voltage in response to presence of a difference between the reference voltage and a voltage at an output of the subtractor circuit.

In some embodiments, the reference voltage reflects a reference classification, which is acquired by manually comparing the default voltage and the practical voltage.

In some embodiments, the IC device further includes a voltage divider and an adder circuit. The voltage divider is configured to receive a voltage from the subtractor circuit. The adder circuit has an input coupled to an output of the voltage divider, and another input coupled to a default weight.

In some embodiments, the IC device further includes an inverter and a multiplier circuit. The inverter has an input coupled to an output of the adder circuit. The multiplier circuit has an input coupled to an output of the inverter, and another input coupled to the default voltage.

Another aspect of the present disclosure provides a circuitry. The circuitry includes a driver and a machine-learning circuit. The driver is configured to drive a signal. The machine-learning circuit includes a comparator. The comparator has an input, wherein the input is coupled to a learned voltage in response to a discrepancy between an immature classification and a reference classification, wherein the machine-learning circuit is configured to adjust a slew rate of the signal based on the learned voltage.

In some embodiments, the comparator is configured to generate an information on the immature classification by comparing a default voltage to a practical voltage.

In some embodiments, a differential of the default voltage determines a default slew rate of the signal.

In some embodiments, the machine-learning circuit further includes a measurement circuit. The measurement circuit is configured to provide the practical voltage by practically measuring the signal.

In some embodiments, the measurement circuit includes a first sample-and-hold circuit, a second sample-and-hold circuit and a subtractor circuit. The first sample-and-hold circuit is configured to sample a first voltage of the signal. The second sample-and-hold circuit is configured to sample a second voltage of the signal. The subtractor circuit is configured to provide the practical voltage by subtracting the first voltage from the second voltage.

In some embodiments, a differential of the practical voltage determines a practical slew rate of the signal.

In some embodiments, the machine-learning circuit further includes an adder circuit. The adder circuit is configured to provide an updated weight by adding a variation reflecting the discrepancy to a default weight.

In some embodiments, the learned voltage is a function of the updated weight.

In the present disclosure, human effort is no longer required after the inference stage of the machine-learning circuit (MLC) is completed. Using the MLC to adjust a slew rate is relatively convenient.

In the comparative approaches, a size of the oscilloscope for measuring a voltage of the signal is relatively large. Moreover, a slew rate is required to be adjusted manually. As a result, the comparative approach is relatively inconvenient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
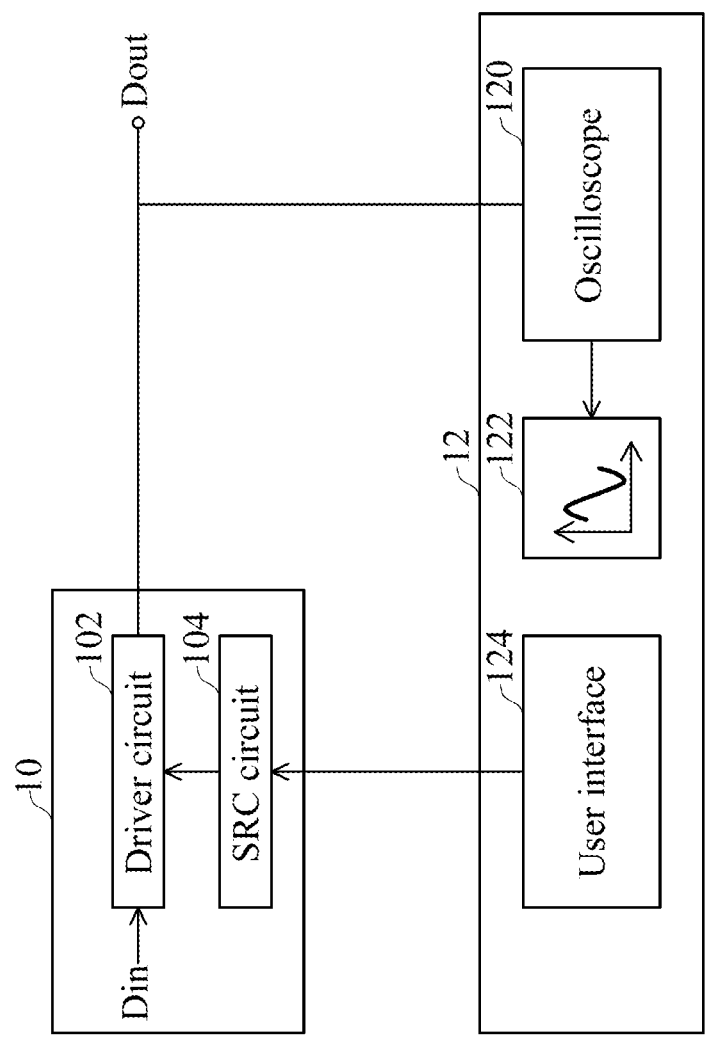
FIG. 1 is a schematic diagram illustrating a comparative approach to adjusting a slew rate of a signal.

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearances of the phrases "in some embodiments" or "in an embodiment" in various places throughout this specification do not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meaning as that commonly understood by a person having ordinary skill in the art to which the embodiments of the present disclosure belong. It should be understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Machine learning is used in a variety of settings to perform tasks through the use of examples. For example, neural networks may be used to perform a task without task-specific programming. That is, neural networks may be trained from prior data to classify or infer information from current data. For instance, training data may be used to identify slew rates of a signal output from a driver by analyzing voltage of the signal. While slew rate identification based on voltages is used as an example, this is simply meant to be illustrative and any suitable neural network task may be performed by the embodiments described below.

FIG. 1 is a schematic diagram illustrating a comparative approach to adjusting a slew rate of a signal. Referring to FIG. 1, an integrated circuit (IC) device 10 includes a driver circuit 102 and a slew rate control (SRC) circuit 104. The driver circuit 102 functions to receive a signal Din, and drives a signal Dout off the IC device 10 by increasing a driving ability of the signal Din. A slew rate of the signal Dout is controllable according to a slew rate provided by the SRC circuit 104. Initially, the SRC circuit 104 provides a default slew rate to the driver circuit 102, and the driver circuit 102 drives the signal Dout, wherein the signal Dout has the default slew rate. The default slew rate may be a certain value, or may be values in a range.

Generally, a default slew rate is designed to satisfy a requirement of a specification. In a circumstance where an electrical characteristic of the signal Dout is not ideal, a user tests the IC device 10 on a user application 12. An oscilloscope 120 of the user application 12 measures voltage of the signal Dout, and the oscilloscope 120 shows a plot of a voltage waveform 122 on a user interface 124 of the user application 12 based on the measurement. The user views and calculates a practical slew rate of the signal Dout based on the voltages shown on, for example, a monitor of the user interface 124. Next, the user sends a command, for example, binary digits, to the SRC circuit 104 via, for example, a keyboard, mouse, touch display, buttons, or other controls of the user interface 124. Alternatively, the user sends a command via input pins or firmware codes of the IC device 10. The SRC circuit 104 either increases or decreases a slew rate of the signal Dout according to the command.

Figure 2:
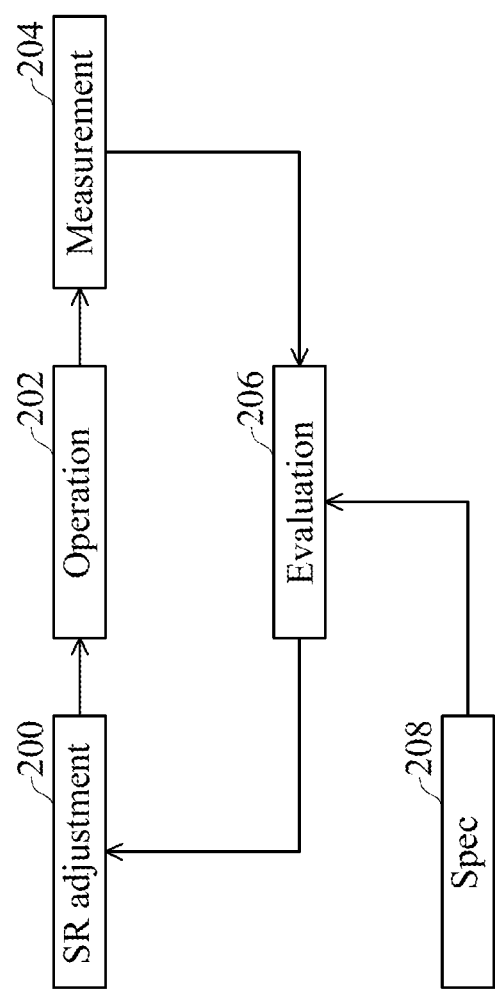
FIG. 2 illustrates an iteration flow of the comparative approach illustrated with reference to FIG. 1.

FIG. 2 illustrates an iteration flow of the comparative approach illustrated with reference to FIG. 1. Referring to FIG. 2, the iteration flow includes operations 200, 202, 204, 206 and 208. It should be noted that the "evaluation" procedure indicated in operation 206 does not represent a function of a software module, but rather represents the steps that the user takes to evaluate a measurement taken in operation 204 before returning to the slew rate (SR) adjustment procedure in operation 200 for another iteration of the adjustment procedure.

In the adjustment flow, a slew rate of the signal Dout is adjusted in operation 200 until the measurement in operation 204 of the signal Dout generated in operation 202 meets a specification acquired in operation 208, when such measurement is evaluated by the user in operation 206. It should be noted that the specification may be critical for the evaluation in operation 206. Moreover, it should be noted that the specification is typically informal and may not be entered by the user application 12 of FIG. 1.

In summary, the foregoing operation is iteratively performed until the adjusted slew rate satisfies the requirement of a specification. A size of the oscilloscope 120 for measuring voltage of the signal Dout is relatively large. Moreover, a slew rate is required to be adjusted manually. As a result, the comparative approach is relatively inconvenient.

Figure 3:
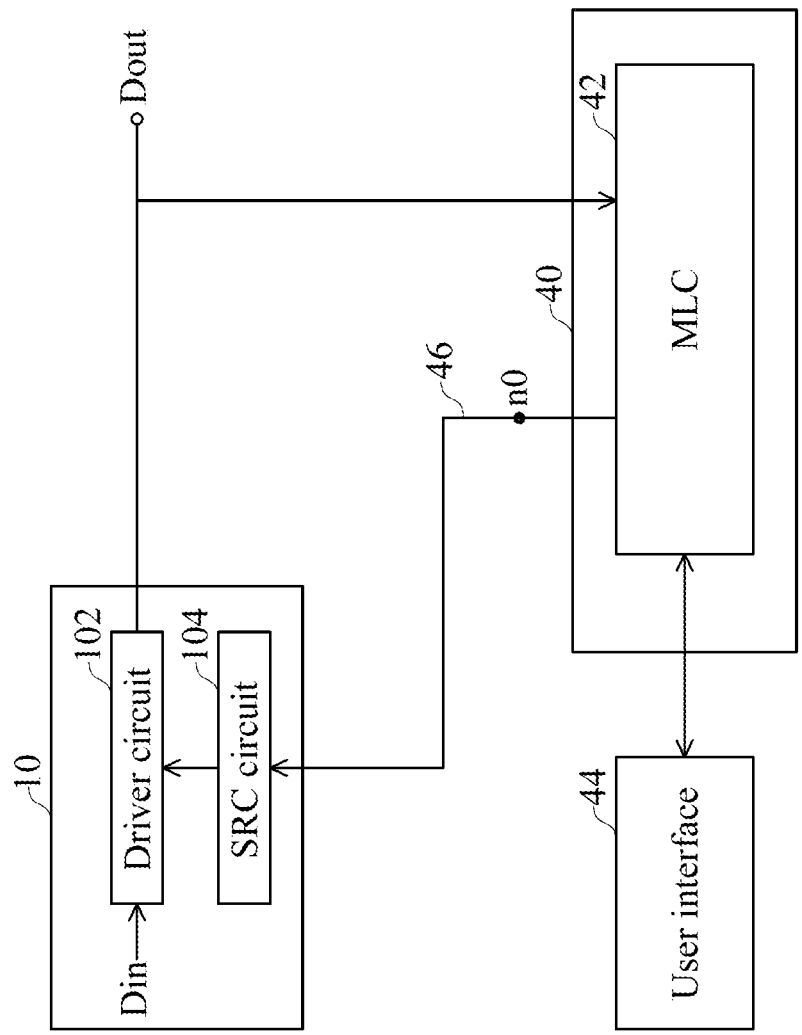
FIG. 3 is a schematic diagram of a circuitry with a machine learning circuit, in accordance with some embodiments of the present disclosure.

FIG. 3 is a schematic diagram of a circuitry 30 with a machine learning circuit (MLC) 42, in accordance with some embodiments of the present disclosure. Referring to FIG. 3, the circuitry 30 includes the IC device 10 and an integrated circuit device 40 including the MLC 42. In some embodiments, the IC device 10 and the IC device 40 are integrated in a single chip. In some embodiments, the IC device 10 and the IC device 40 are individually integrated in different chips and communicate with each other via a motherboard on which the IC device 10 and the IC device 40 are disposed.

The MLC 42 functions to perform one or more tasks via machine learning. The MLC 42 is communicatively coupled to the IC device 10 via interconnection circuitry 46, such as a communication bus. Initially, the MLC 42 enters a training stage as described in detail with reference to FIG. 5. Subsequent to the training stage, the MLC 42 enters an inference/classification stage as described in detail with reference to FIG. 5 to control the SRC circuit 104 to adjust a slew rate of the signal Dout. Next, the MLC 42 enters a prediction stage 316 as described in detail with reference to FIG. 5 to perform prediction. Once the prediction stage 316 is entered and after the training of the MLC 42 is completed, human effort is no longer required. Using the MLC 42 to adjust a slew rate is relatively convenient.

Figure 4:
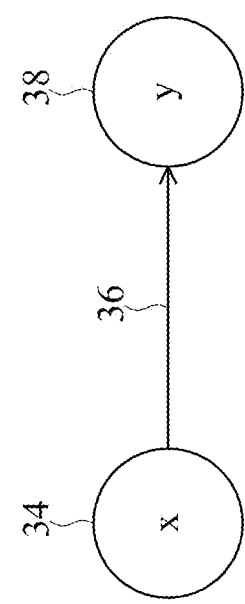
FIG. 4 is a network diagram of a neural network used to perform tasks via the machine learning circuit of FIG. 3, in accordance with some embodiments of the present disclosure.

FIG. 4 is a network diagram of a neural network 32 used to perform tasks via the MLC 42 of FIG. 3, in accordance with some embodiments of the present disclosure. While the neural network 32 is described in detail as an example, any suitable machine learning methods and techniques may be used.

The neural network 32 includes an input 34, a weighted value 36, and a resultant value 38. The input 34 is weighted with a weight to determine the weighted value 36. The resultant value 38 is generated based on the weighted value 36. While one input is shown, this is meant to be illustrative and any suitable combination of inputs, weightings, and connections therebetween may be used.

Figure 5:
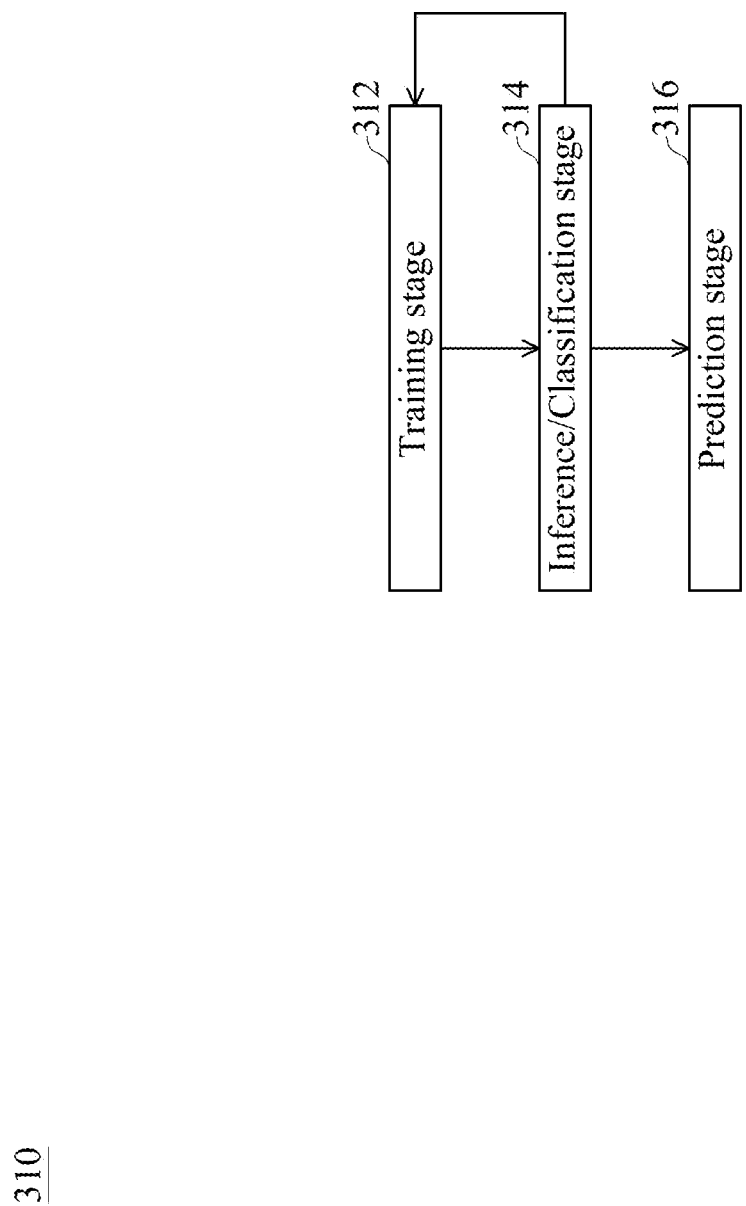
FIG. 5 is a flow diagram of a process performed by the machine learning circuit of FIG. 3, in accordance with some embodiments of the present disclosure.

FIG. 5 is a flow diagram of a process 310 performed by the MLC 42 of FIG. 3, in accordance with some embodiments of the present disclosure. Referring to FIG. 3, the process 310 includes the training stage 312, the inference/classification stage 314 and the prediction stage 316. In the training stage 312, the MLC 42 performs training in which the weighted value 36 shown in FIG. 4 is determined and/or adjusted.

After training the neural network 32 of FIG. 4, in the inference/classification stage 314, the MLC 42 may perform inferences and/or classifications on verification data. In the present embodiment involving adjustment of a slew rate, for example, the neural network 32 is trained using voltages of the signal Dout. Next, the MLC 42 classifies verification data comprising voltages of the signal Dout using the neural network 32 after the weight has been adjusted based on the training data.

Next, in the prediction stage 316, the MLC 42 performs prediction based on the classification results in the stage 314.

Figure 6:
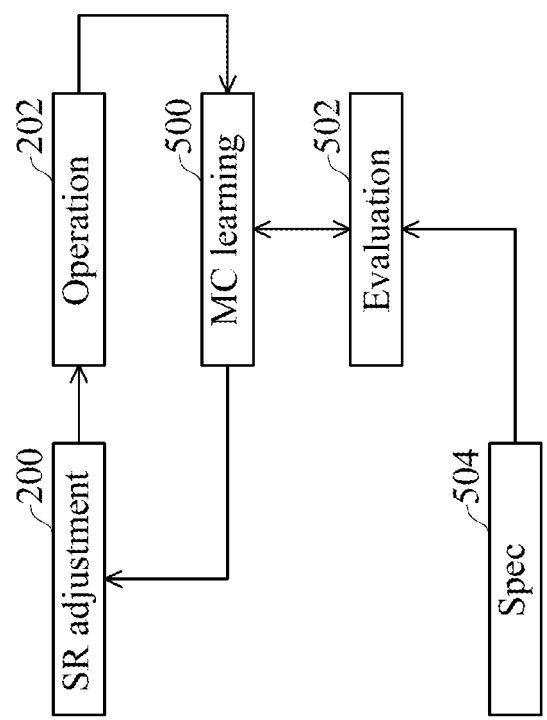
FIG. 6 is a flow diagram illustrating an iteration flow based on the circuitry with the machine learning circuit of FIG. 3, in accordance with some embodiments of the present disclosure.

FIG. 6 is a flow diagram illustrating iteration flow based on the circuitry 30 with the MLC 42 of FIG. 3, in accordance with some embodiments of the present disclosure. Referring to FIG. 6, the iteration flow is similar to the iteration flow described and illustrated with reference to FIG. 2 except that, for example, the iteration flow includes a machine learning procedure (labeled as MC learning in FIG. 6) in operation 500 and acquisition of a specification in operation 504. In operation 500, the MLC 42 learns and generates an immature classification. The user provides a reference classification to the MLC 42. The MLC 42 adjusts a weight if the immature classification is not correct. In the present disclosure, the correct classification indicates that the immature classification is identical to the reference classification. The foregoing process is repeatedly performed until in operation 502 it is determined that a correction ratio acquired in the specification in operation 504 is satisfied. The correction ratio refers to a ratio of a quantity of a correct classification to a total quantity of classification.

Figure 7:
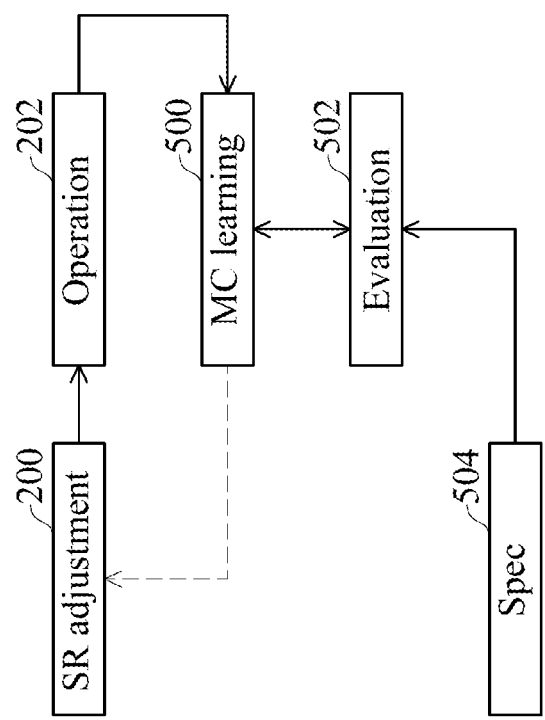
FIG. 7 is a flow diagram illustrating a training stage and inference stage shown in FIG. 5 based on the iteration flow of FIG. 6, in accordance with some embodiments of the present disclosure.

FIG. 7 is a flow diagram illustrating the training stage 312 shown in FIG. 5 based on the iteration flow of FIG. 6, in accordance with some embodiments of the present disclosure. Referring to FIG. 7, in the training stage 312, the SR adjustment in operation 200 is not performed. In operation 500, for example, one hundred units of data are collected, wherein eighty units serve as training data, and twenty units serve as verification data. The weighted value 36 is acquired based on the training data. Next, the inference/classification stage 314 is entered. In the inference/classification stage 314, the MLC 42 classifies the verification data based on the weighted value 36. After the classification of the verification data, the user compares such classification to the reference classification, thereby obtaining a correction ratio. If such correction ratio satisfies a required correction ratio obtained in the specification in operation 504, the inference/classification stage 314 is finished, and the prediction stage 316 is entered. If the correction ratio does not satisfy the required correction ratio, the foregoing process is repeated.

Figure 8:
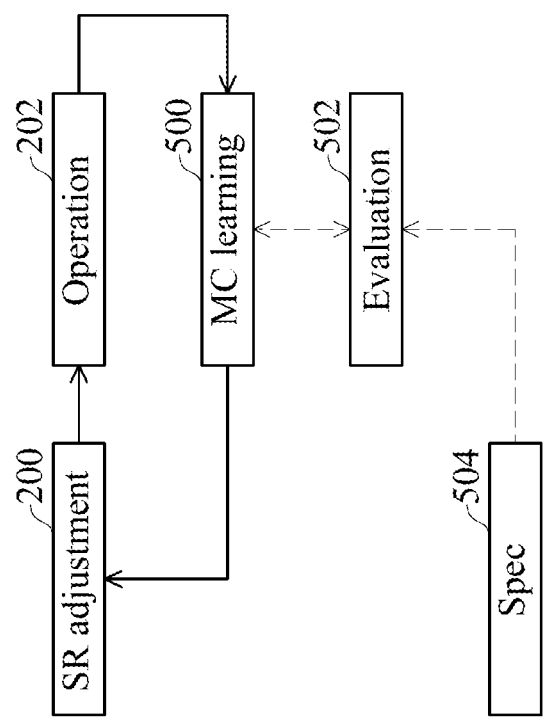
FIG. 8 is a flow diagram illustrating the prediction stage shown in FIG. 5 based on the iteration flow of FIG. 6, in accordance with some embodiments of the present disclosure.

FIG. 8 is a flow diagram illustrating the prediction stage 316 shown in FIG. 5 based on the iteration flow of FIG. 6, in accordance with some embodiments of the present disclosure. Referring to FIG. 8, the evaluation shown in operation 502 is not performed. The MLC 42 controls the SRC circuit 104 without the involvement of human effort. Therefore, using the MLC 42 to adjust a slew rate is relatively convenient.

Figure 9:
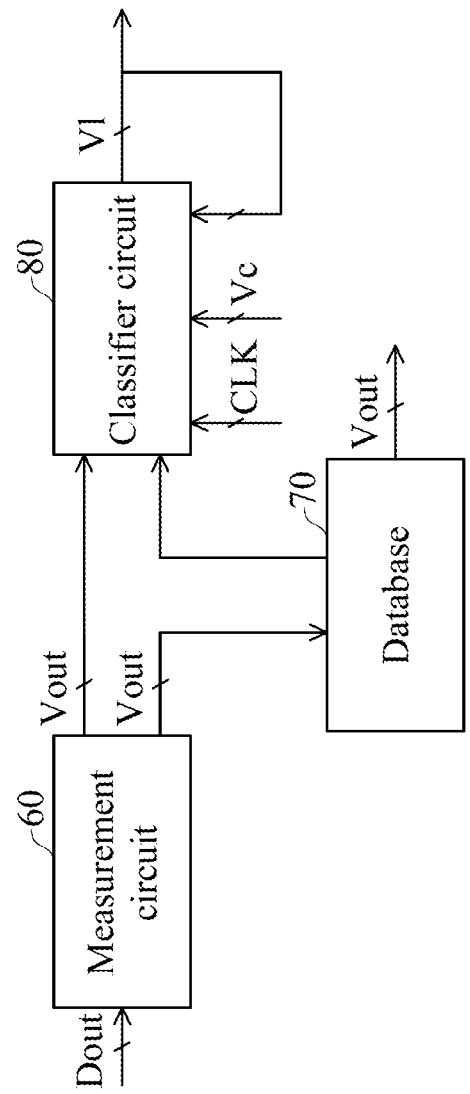
FIG. 9 is a schematic diagram of the machine learning circuit of FIG. 3, in accordance with some embodiments of the present disclosure.

FIG. 9 is a schematic diagram of the MLC 42 of FIG. 3, in accordance with some embodiments of the present disclosure. Referring to FIG. 9, the MLC 42 includes a measurement circuit 60, a database 70 and a classifier circuit 80.

The measurement circuit 60 functions to acquire a practical voltage Vout of the signal Dout by practically measuring the signal Dout, and provide the practical voltage Vout. A differential of the practical voltage Vout determines a practical slew rate of the signal Dout. The measurement circuit 60 provides a plurality of values of the practical voltage Vout to the database 70 for storing. The database 70 provides the practical voltage Vout to the user interface 44. The user interface 44, for example, shows the practical voltage Vout on a display of the user interface 44.

The classifier circuit 80 retrieves the voltage Vout from the database 70. In addition, the classifier circuit 80 receives a reference voltage Vc reflecting an information on a reference classification. The reference classification is acquired by manually comparing a default voltage VT and the practical voltage Vout. A differential of the default voltage VT determines a default slew rate, stated in a specification, of the signal Dout. Subsequently, the classifier circuit 80 generates a voltage V1 reflecting an information on an immature classification by comparing the default voltage VT and the practical voltage Vout.

In the training stage 312, the classifier circuit 80 updates the default voltage VT to a learned voltage based on the immature classification and the reference classification. The learned voltage includes a weighted value of the neural network 32. The MLC 42 adjusts a slew rate of the signal Dout based on the learned voltage.

In the prediction stage 316, the classifier circuit 80 generates a prediction, based on the learned voltage, for adjusting a slew rate of the signal Dout.

Figure 10:
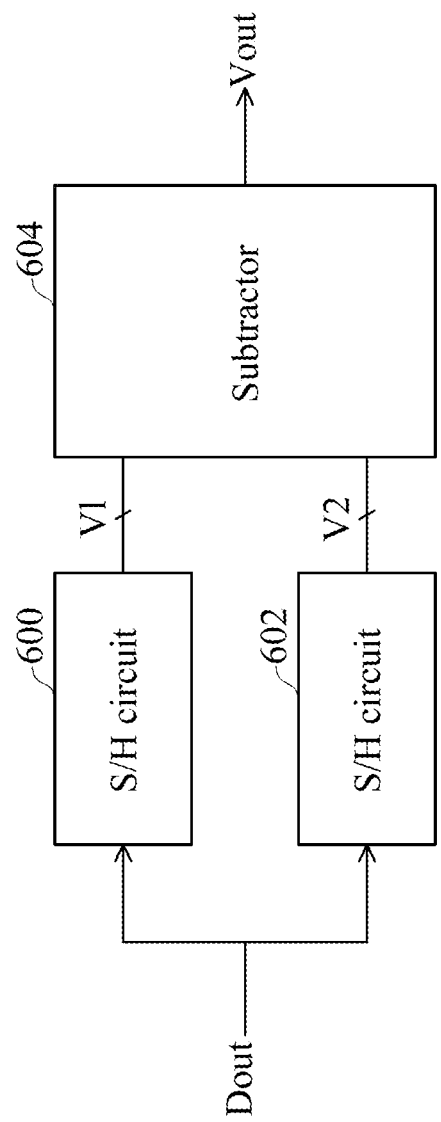
FIG. 10 is a schematic diagram of the measurement circuit of FIG. 9, in accordance with some embodiments of the present disclosure.

FIG. 10 is a schematic diagram of the measurement circuit 60 of FIG. 9, in accordance with some embodiments of the present disclosure. Referring to FIG. 10, the measurement circuit 60 includes sample-and-hold (S/H) circuits 600 and 602, and a subtractor 604.

The S/H circuit 600 functions to sample a first voltage V1 of the signal Dout. In some embodiments, the S/H circuit 600 includes a switch, a capacitor and an op-based amplifier. In some embodiments, the S/H circuit 600 includes any well-known S/H circuit.

The S/H circuit 602 functions to sample a second voltage V2 of the signal Dout. In some embodiments, the S/H circuit 602 includes a switch, a capacitor and an op-based amplifier. In some embodiments, the S/H circuit 602 includes any well-known S/H circuit.

The subtractor 604 functions to provide the practical voltage Vout by subtracting the first voltage V1 from the second voltage V2. Therefore, the practical voltage Vout is associated with the first voltage V1 and the second voltage V2.

Figure 11:
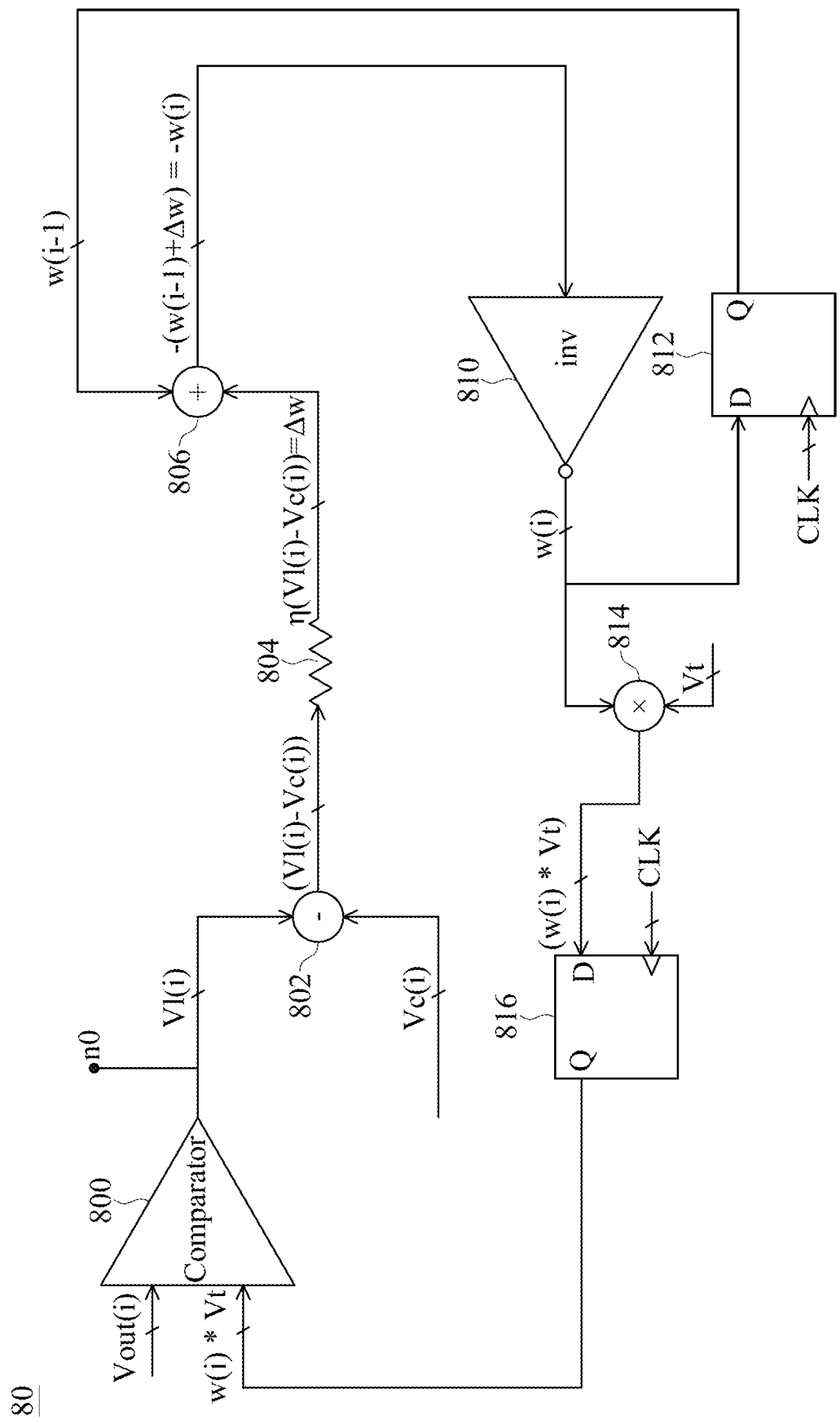
FIG. 11 is a schematic diagram of the classifier circuit of FIG. 9, in accordance with some embodiments of the present disclosure.

FIG. 11 is a schematic diagram of the classifier circuit 80 of FIG. 9, in accordance with some embodiments of the present disclosure. Referring to FIG. 11, the classifier circuit 80 includes a comparator 800, a subtractor circuit 802, a voltage divider 804, an adder circuit 806, an inverter 810, a register 812, a multiplier 814 and a register 816. In FIG. 11, a symbol (i) represents a characteristic at the present time; and symbol (i+1) represents a characteristic at the next time.

The comparator 800 has an input coupled to the practical voltage Vout(i), another input coupled to a voltage indicated by the expression (w(i)*Vt), and an output coupled to a node n0, wherein w(i) in the expression represents a weight of the neural network 32 and Vt represents the default voltage. The weight w(i) is initially one, and is called a default weight. Therefore, the another input of the comparator 800 is initially coupled to the default voltage Vt. The comparator 800 is configured to generate an information on the immature classification by comparing the default voltage Vt to the practical voltage Vout.

The subtractor circuit 802 has an input coupled to an output of the comparator 800 and another input coupled to a reference voltage, thereby subtracting the reference voltage Vc(i) from the voltage V1(i). Accordingly, the subtractor circuit 802 provides a voltage (V1(i)-Vc(i)) to the voltage divider 804. Therefore, the voltage divider 804 provides a voltage η(V1-Vc), wherein η represents a learning rate, and η ranges from about 0 to about 1.

The adder circuit 806 has an input coupled to a default weight w(i−1), and another input coupled to an output of the voltage divider 804. In some embodiments, the adder circuit 806 includes an OP-based adder circuit. Accordingly, the adder circuit 806 provides an inverse updated weight −w(i) by adding a variation reflecting the discrepancy to the default weight w(i−1), wherein the discrepancy is between an immature classification and a reference classification. The inverse updated weight −w(i) is inverted to the updated weight w(i) by the inverter 810. In summary, the updated weight w(i) is associated with the default weight w(i−1), in particular with an algebraic relationship between the difference (V1(i)−Vc(i)) and the default weight w(i−1).

The register 812 temporarily provides the default weight w(i−1), and provides the updated weight w(i) in response to a clock signal CLK when the updated weight w(i) is generated.

The multiplier 814 has an input coupled to an output of the inverter 810, and another input coupled to the default voltage Vt. Accordingly, the multiplier 814 functions to generate a learned voltage (w(i)*Vt) by multiplying the default voltage Vt by the updated weight w(i). The register 816 temporarily provides the default voltage Vt, and provides the learned voltage (w(i)*Vt) in response to the clock signal CLK when the updated weight w(i) is generated. The learned voltage (w(i)*Vt) is a function of the updated weight w(i). In summary, the another input of the comparator 800 is coupled from the default voltage Vt to the learned voltage (w(i)*Vt) in response to presence of a difference between the reference voltage Vc and the voltage (V1-Vc) at an output of the subtractor circuit 802. In other words, the another input of the comparator 800 is coupled to the learned voltage (w(i)*Vt) in response to a discrepancy between an immature classification and a reference classification.

After the inference/classification stage 314 is entered, the comparator 800 provides the voltage V1(i) to the SRC circuit 104, thereby adjusting a slew rate of the signal Dout.

Figure 12:
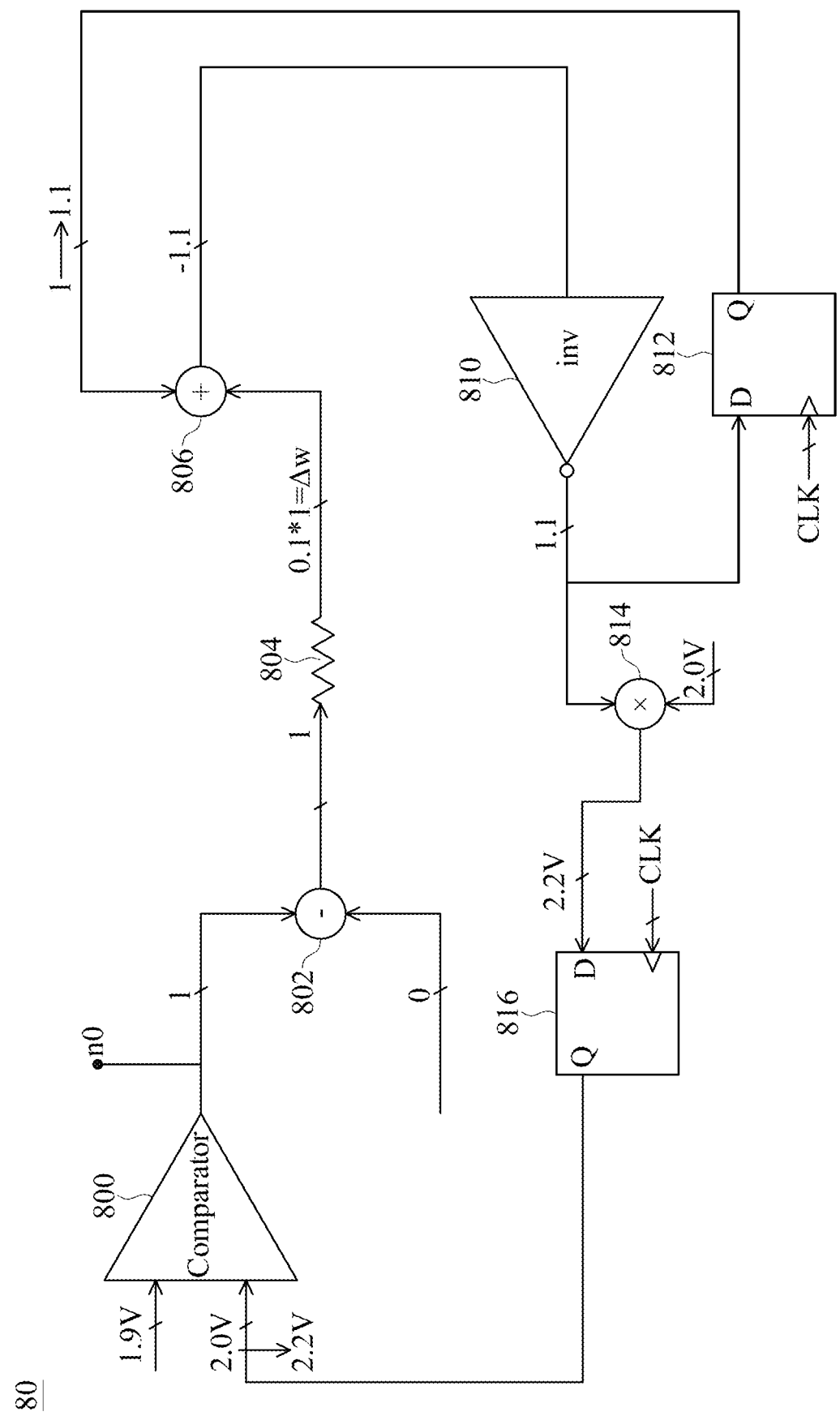
FIG. 12 is a schematic diagram illustrating an exemplary operation of the classifier circuit of FIG. 9 at the training stage shown in FIG. 5, in accordance with some embodiments of the present disclosure.

FIG. 12 is a schematic diagram illustrating an exemplary operation of the classifier circuit 80 of FIG. 9 at the training stage shown in FIG. 5, in accordance with some embodiments of the present disclosure. Referring to FIG. 12, it is assumed that a learning rate η is 0.1; a default voltage Vt is 2.0 V; and a practical voltage Vout is 1.9 V less than the default voltage Vt. Ideally, the comparator 800 is supposed to provide a logic low ("0"). However, the comparator 800 provides a logic high ("1") indicating an immature classification, possibly due to an adverse result of a semiconductor manufacturing process or low noise margin. The user recognizes such misclassification manually. The user provides a logic low ("0") to the subtractor circuit 802. Accordingly, the subtractor circuit 802 provides a logic high ("1") to the voltage divider 804. The adder circuit 806 adds the difference (V1(i)-Vc(i)) of 0.1 to the default weight of 1, and provides the inverse updated weight of -1.1. The inverter 810 inverts the inverse updated weight, and provides the updated weight of 1.1. The register 812 updates the default weight of 1 to the updated weight of 1.1. The multiplier 814 multiplies the default voltage of 2.0 V by the updated weight of 1.1, and provides the learned voltage 2.2 V to the register 816. The register 816 updates the default voltage of 2.0 V to the learned voltage of 2.2 V coupled to the another input of the comparator 800. The learned voltage of 2.2 V is higher than the default voltage of 2.0 V. If the subsequent practical voltage Vout is close to the previous practical voltage Vout, the probability of acquiring correct classification is increased with the learned voltage of 2.2 V, compared to the default voltage of 2.0 V. As a result, the prediction generated by the comparator 800 for adjusting a slew rate of the signal Dout is more likely to be correct.

Figure 13:
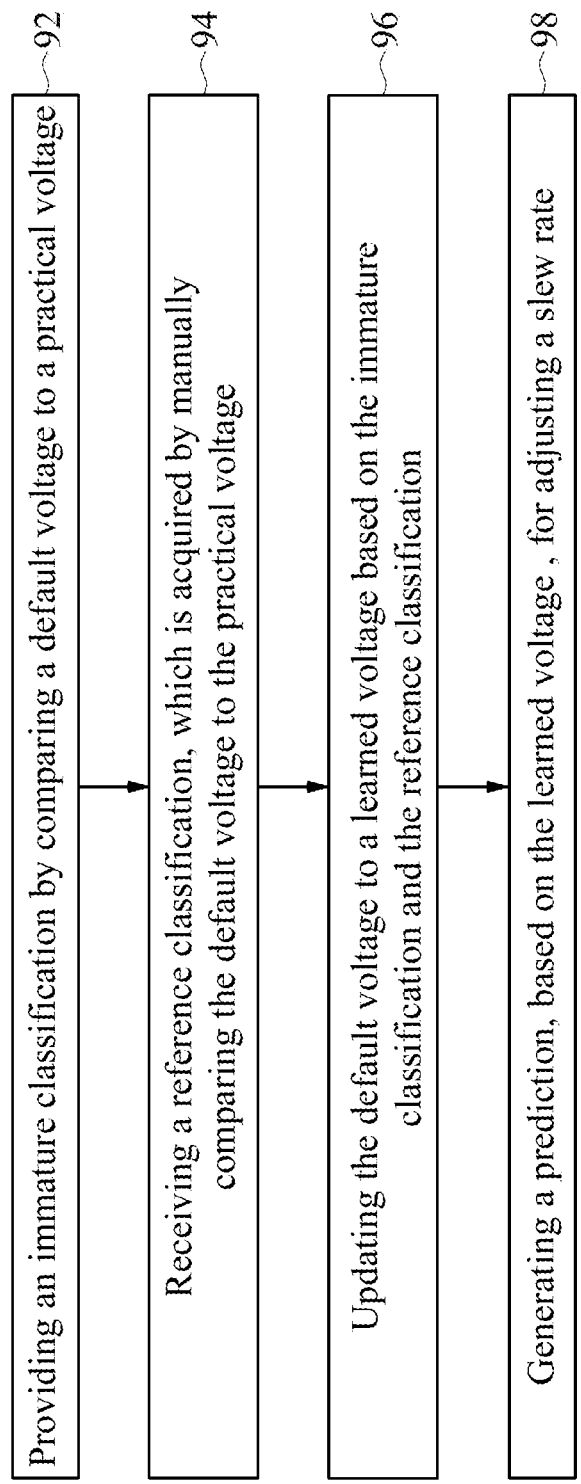
FIG. 13 is a flowchart of a method of adjusting a slew rate of a signal, in accordance with some embodiments of the present disclosure.

FIG. 13 is a flowchart of a method 90 of adjusting a slew rate of a signal, in accordance with some embodiments of the present disclosure. Referring to FIG. 13, the method 90 includes operations 92, 94, 96 and 98.

The method 90 begins with operation 92, in which an immature classification is provided by comparing a default voltage to a practical voltage.

The method 90 continues with operation 94, in which a reference classification is received, wherein the reference classification is acquired by manually comparing the default voltage to the practical voltage.

The method 90 proceeds to operation 96, in which the default voltage is updated to a learned voltage based on the immature classification and the reference classification.

The method 90 continues with operation 98, in which a prediction is generated, based on the learned voltage, for adjusting a slew rate.

The method 90 is merely an example, and is not intended to limit the present disclosure beyond what is explicitly recited in the claims. Additional operations can be provided before, during, and after the method 90, and some operations described can be replaced, eliminated, or moved around for additional embodiments of the method.

In the present disclosure, the MLC 42 controls the SRC circuit 104 without the involvement of human effort. Therefore, using the MLC 42 to adjust a slew rate is relatively convenient.

One embodiment of the present disclosure provides an integrated circuit (IC) device. The IC device includes a measurement circuit and a classifier circuit. The measurement circuit is configured to acquire a practical voltage. The classifier circuit is configured to generate an information on an immature classification by comparing a default voltage and the practical voltage. The classifier circuit is configured to receive an information on a reference classification, which is acquired by manually comparing the default voltage and the practical voltage. The classifier circuit is configured to update the default voltage to a learned voltage based on the immature classification and the reference classification. The classifier circuit is configured to generate a prediction, based on the learned voltage, for adjusting a slew rate.

Another aspect of the present disclosure provides an integrated circuit (IC) device. The IC device includes a comparator and a subtractor circuit. The comparator has an input coupled to a practical voltage. The subtractor circuit has an input coupled to an output of the comparator and another input coupled to a reference voltage. Another input of the comparator is coupled from a default voltage to a learned voltage in response to presence of a difference between the reference voltage and a voltage at an output of the subtractor circuit.

Another aspect of the present disclosure provides a circuitry. The circuitry includes a driver and a machine-learning circuit. The driver is configured to drive a signal. The machine-learning circuit is includes a comparator. The comparator has an input, wherein the input is coupled to a learned voltage in response to a discrepancy between an immature classification and a reference classification, wherein the machine-learning circuit is configured to adjust a slew rate of the signal based on the learned voltage.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) device, comprising:
   a measurement circuit configured to acquire a practical voltage; and
   a classifier circuit configured to:
   generate an information on an immature classification by comparing a default voltage and the practical voltage;
   receive an information on a reference classification, which is acquired by manually comparing the default voltage and the practical voltage;
   update the default voltage to a learned voltage based on the immature classification and the reference classification; and generate a prediction, based on the learned voltage, for adjusting a slew rate,
wherein the measurement circuit includes:
a first sample-and-hold circuit configured to sample a first voltage of a signal; and
a second sample-and-hold circuit configured to sample a second voltage of the signal, and
wherein the practical voltage is associated with the first voltage and the second voltage.

2. The IC device of claim 1, wherein a differential of the practical voltage determines a practical slew rate of a signal, and a differential of the default voltage determines a default slew rate of the signal.

3. The IC device of claim 1, wherein the learned voltage includes a weighted value of a neural network.

4. The IC device of claim 1, wherein the measurement circuit further includes:
a subtractor circuit configured to provide the practical voltage by subtracting the first voltage from the second voltage.

5. The IC device of claim 1, wherein a difference between the immature classification and the reference classification is associated with a weight of a neural network, and the learned voltage includes a weighted value of the neural network.

6. The IC device of claim 5, wherein the classifier circuit further comprises:
a multiplier configured to generate the learned voltage by multiplying the default voltage by an updated weight, wherein the updated weight is associated with a default weight.

7. The IC device of claim 6, wherein the updated weight is associated with an algebraic relationship between the difference and the default weight.

8. An integrated circuit (IC) device, comprising:
a comparator having an input coupled to a practical voltage;
a subtractor circuit having an input coupled to an output of the comparator and another input coupled to a reference voltage;
a voltage divider configured to receive a voltage from the subtractor circuit; and
an adder circuit having an input coupled to an output of the voltage divider, and another input coupled to a default weight,
wherein another input of the comparator is coupled from a default voltage to a learned voltage in response to presence of a difference between the reference voltage and a voltage at an output of the subtractor circuit.

9. The IC device of claim 8, wherein the reference voltage reflects a reference classification, which is acquired by manually comparing the default voltage and the practical voltage.

10. The IC device of claim 8, further comprising:
an inverter having an input coupled to an output of the adder circuit; and
a multiplier circuit having an input coupled to an output of the inverter, and another input coupled to the default voltage.

11. A circuitry, comprising:
a driver configured to drive a signal; and
a machine-learning circuit including:
a comparator having an input, wherein the input is coupled to a learned voltage in response to a discrepancy between an immature classification and a reference classification,
wherein the machine-learning circuit is configured to adjust a slew rate of the signal based on the learned voltage,
wherein the comparator is configured to generate an information on the immature classification by comparing a default voltage to a practical voltage, and
wherein the machine-learning circuit further includes:
an adder circuit configured to provide an updated weight by adding a variation reflecting the discrepancy to a default weight.

12. The circuitry of claim 11, wherein a differential of the default voltage determines a default slew rate of the signal.

13. The circuitry of claim 11, wherein the machine-learning circuit further includes:
a measurement circuit configured to provide the practical voltage by practically measuring the signal.

14. The circuitry of claim 13, wherein the measurement circuit includes:
a first sample-and-hold circuit configured to sample a first voltage of the signal;
a second sample-and-hold circuit configured to sample a second voltage of the signal; and
a subtractor circuit configured to provide the practical voltage by subtracting the first voltage from the second voltage.

15. The circuitry of claim 13, wherein a differential of the practical voltage determines a practical slew rate of the signal.

16. The circuitry of claim 11, wherein the learned voltage is a function of the updated weight.

* * * * *